United States Patent [19]

Takeuchi

[11] Patent Number: 4,717,835
[45] Date of Patent: Jan. 5, 1988

[54] SEMICONDUCTOR INTEGRATED CIRCUIT WITH DETECTION CIRCUIT FOR ADDRESS SIGNAL CHANGE

[75] Inventor: Atsushi Takeuchi, Kawasaki, Japan

[73] Assignee: Fujitsu Limited, Kanagawa, Japan

[21] Appl. No.: 3,898

[22] Filed: Jan. 16, 1987

[30] Foreign Application Priority Data

Jan. 28, 1986 [JP] Japan ................................. 61-16051

[51] Int. Cl.⁴ ........................ H03K 5/153; G11C 8/00
[52] U.S. Cl. .................................. 307/265; 307/267; 307/603; 307/269; 307/480; 365/230
[58] Field of Search ............... 307/354, 269, 480, 527, 307/528, 463, 449, 231, 517, 356, 358, 265, 267, 602, 603; 365/230, 233; 328/111

[56] References Cited

U.S. PATENT DOCUMENTS

| | | | |
|---|---|---|---|
| 4,286,174 | 8/1981 | Dingwall | 307/242 |
| 4,524,291 | 6/1985 | Lehning | 307/354 |
| 4,614,883 | 9/1986 | Sood et al. | 307/449 |
| 4,633,102 | 12/1986 | Childers | 307/354 |

Primary Examiner—Stanley D. Miller
Assistant Examiner—Richard Roseen
Attorney, Agent, or Firm—Armstrong, Nikaido, Marmelstein & Kubovcik

[57] ABSTRACT

A semiconductor integrated circuit with a detection circuit for detecting an address signal change comprises a plurality of gate circuits, and a plurality of delay circuits able to be reset, and each delay circuit is reset when the address signal or an inversion signal thereof is at a predetermined polarity and level. Whereby, the semiconductor integrated circuit can generate a pulse having a pulse width no shorter than a predetermined time interval if a change equivalent to the address change is caused by successive noise.

4 Claims, 8 Drawing Figures

SEMICONDUCTOR INTEGRATED CIRCUIT WITH DETECTION CIRCUIT FOR ADDRESS SIGNAL CHANGE

BACKGROUND OF THE INVENTION (1) Field of the Invention

The present invention relates to a semiconductor integrated circuit with a detection circuit for detecting an input signal, for example, an address signal change, and particularly, to a semiconductor integrated circuit generating a pulse always having a pulse no shorter than a predetermined (normal) time interval upon a change of an address signal.

(2) Description of the Related Art

Certain semiconductor memory device contain a pulse generating circuit for generating a pulse when an address signal is changed, to promote a discharge of word lines, a short circuit of a pair of bit lines, and a charging of the pair of bit lines. This pulse normally has a constant pulse width, and to achieve the above-mentioned objects, the pulse width must not be shorter than a normal pulse width. If a change equivalent to an address change occurs at a short interval, for some reason, the pulse width becomes narrower than the normal pulse width, and the application of such a pulse will not ensure a continuing normal operation of the memory device.

The present invention is intended to solve the above-mentioned problem.

SUMMARY OF THE INVENTION

An object of the present invention is to provide a semiconductor integrated circuit with a pulse generating circuit, which circuit generates a pulse having always a pulse width no shorter than a predetermined value when an address signal changes.

In the present invention, to accomplish the above-mentioned object, there is provided a semiconductor integrated circuit with a detection circuit for detecting a change of an input signal, for example, an address signal.

This semiconductor integrated circuit comprises first, second, and third gate circuits and first and second delay circuits. The first gate circuit receives an address signal at one input thereof and receives an output of the first delay circuit at the other input thereof. An output of the first gate circuit is supplied to one input of the third gate circuit and to the second delay circuit. The second gate circuit receives an inverted address signal at one input thereof and receives an output of the second delay circuit at the other input thereof. An output of the second gate circuit is supplied to the other input of the third gate circuit and to the first delay circuit. Accordingly, if, for example, the first, second, and third gate circuits are NAND gates, when the address input is low level the first delay circuit is reset and outputs a low level signal, and if the first, second, and third gate circuits are NOR gates, when the address input is high level the first delay circuit is reset and outputs a high level signal. On the other hand if, for example, the first, second, and third gate circuits are NAND gates, when the inverted address input is low level the second delay circuit is reset and outputs a low level signal, and if the first, second, and third gate circuits are NOR gates, when the inverted address input is high level the second delay circuit is reset and outputs a high level signal. As a result, the semiconductor integrated circuit according to the present invention generates a pulse always having a pulse width no shorter than a predetermined value when a change occurs in the address signal.

DESCRIPTION OF THE PREFERRED EMBODIMENTS

Figure 1:
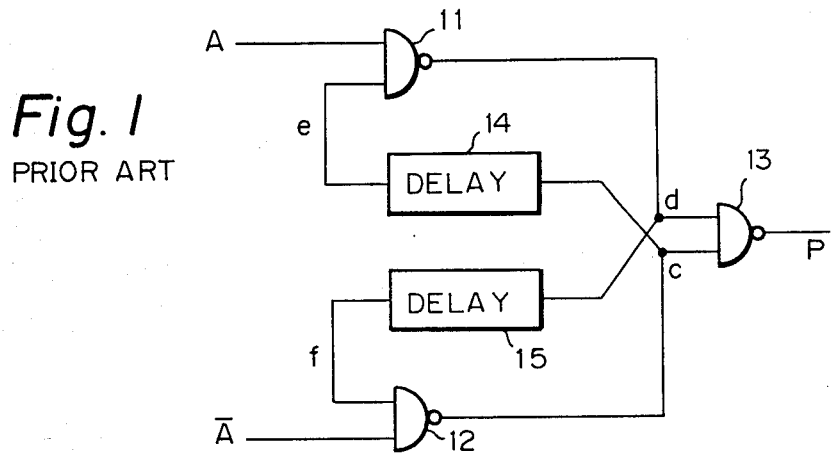
FIG. 1 is a circuit diagram of a conventional circuit generating a pulse upon detection of an address change.
Figure 2:
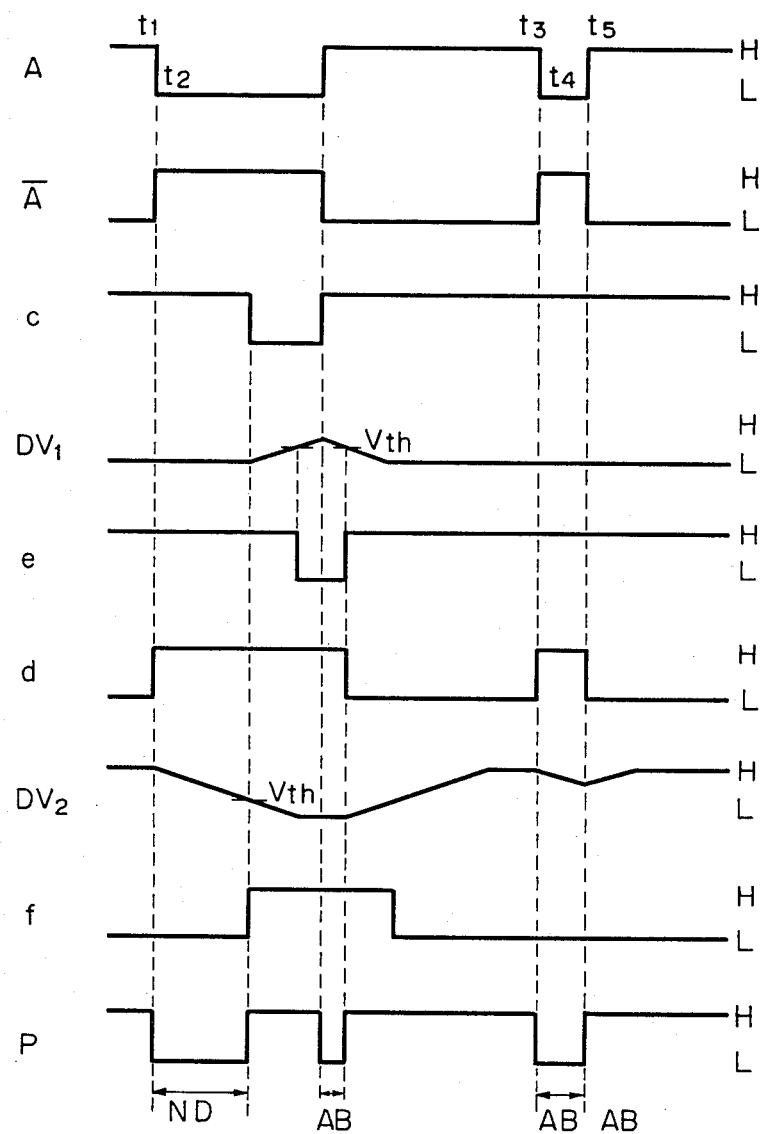
FIG. 2 is a waveform diagram of the circuit in FIG. 1.

Prior to the description of the preferred embodiments, a conventional circuit is explained for comparison with reference to FIG. 1. FIG. 2 shows a waveform diagram in the circuit in FIG. 1.

As shown in FIG. 1, this circuit comprises NAND gates 11, 12, and 13, and delay circuits (DELAY) 14 and 15. The reference character A represents an address signal, $\overline{A}$ represents an inverted address signal, and P represents an output pulse. Referring to the reference characters c to f in the figure, the waveforms thereof are shown in FIG. 2, wherein $DV_1$ and $DV_2$ are charge voltages in the delay circuits 14 and 15, respectively, having polarities opposite to those of the voltages of e and f.

In FIG. 2, as shown at time $t_1$, when the address signal A is high level (H) and the inverted address signal $\overline{A}$ is low level (L), the output c of the NAND gate 12 is H, the output d of the NAND gate 11 is L, and the output P of the NAND gate 13 is H. At time $t_2$, when the address signal A becomes L and the inverted address signal $\overline{A}$ becomes H, the output d of the NAND gate 11 is H, the output c of the NAND gate 12 is still H, and the output P of the NAND gate 13 is L. After the delay time ND by the delay circuit 15, the output f of the delay circuit 15 is H, the output c of the NAND gate 12 is L, and the output P of the NAND gate 13 is H. Thus, when the address signal A goes from H to L and the inverted address signal $\overline{A}$ goes from L to H, the output P which is L during the interval ND, which is equal to the delay time by the delay circuit 15, is obtained. Conversely, when the address signal A goes from L to H and the inverted address signal $\overline{A}$ goes from H to L, the output P which is L during the delay time by the delay circuit 14, is obtained. If the delay times of the delay circuits 14 and 15 are the same, the pulse width of the output P is the same in both cases.

As mentioned above, in the circuit of FIG. 1, a pulse P having a predetermined pulse width is output when the address signal changes. The above cases are the normal case, but if the address signal change occurs within the delay time ND then, as shown at times $t_3$ to $t_5$ in FIG. 2, the pulse width of the output P becomes narrower than the predetermined value ND. Namely, at the time $t_3$, if the address signal A is H, the inverted address signal $\overline{A}$ is L, and the output P is H, and at the time $t_4$, if the address signal A is L and the inverted address signal $\overline{A}$ is H, then the output P is L. Up to this point, the changes in level are the same as described case. However, if during the delay time ND, i.e., before the output f of the delay circuit 15 becomes H, the address signal A becomes H and the inverted address signal $\overline{A}$ becomes L, as shown at the time $t_5$, since the output e of the delay circuit 14 is still H, the output d of the NAND gate 11 immediately becomes L; and thus the output P becomes H.

Usually, a change of the address signal does not occur at an interval shorter than the delay time ND, and the change as shown in the time $t_3$ to $t_5$ in FIG. 2 is an abnormal condition such as a noise insertion. When an abnormal condition occurs in the semiconductor memory device, the pulse width of the output P must not be shorter than the predetermined value ND. If the pulse width is narrower than the value ND, a failure can occur during the memory operation. In FIG. 2, AB shows the abnormal pulse widths; that on the right having a zero width.

Figure 3:
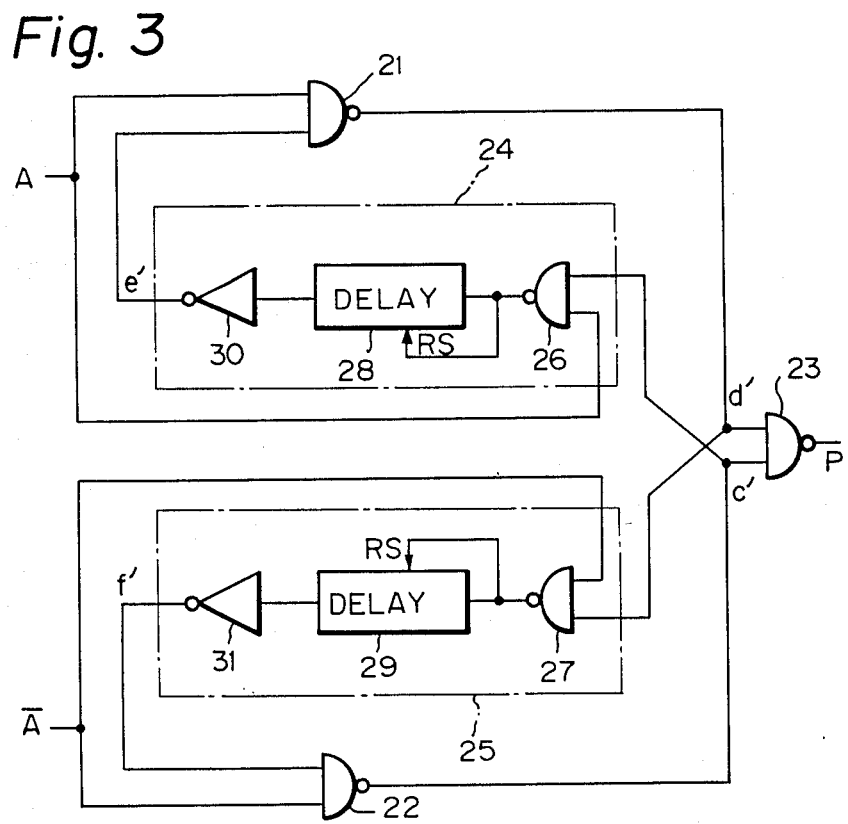
FIG. 3 is a circuit diagram of a semiconductor integrated circuit with a detection circuit for detecting an address signal change according to a first embodiment of the present invention.

FIG. 3 shows a first embodiment of the present invention. The circuit in FIG. 3 comprises NAND gates 21, 22, and 23, and delay circuits 24 and 25.

Figure 4:
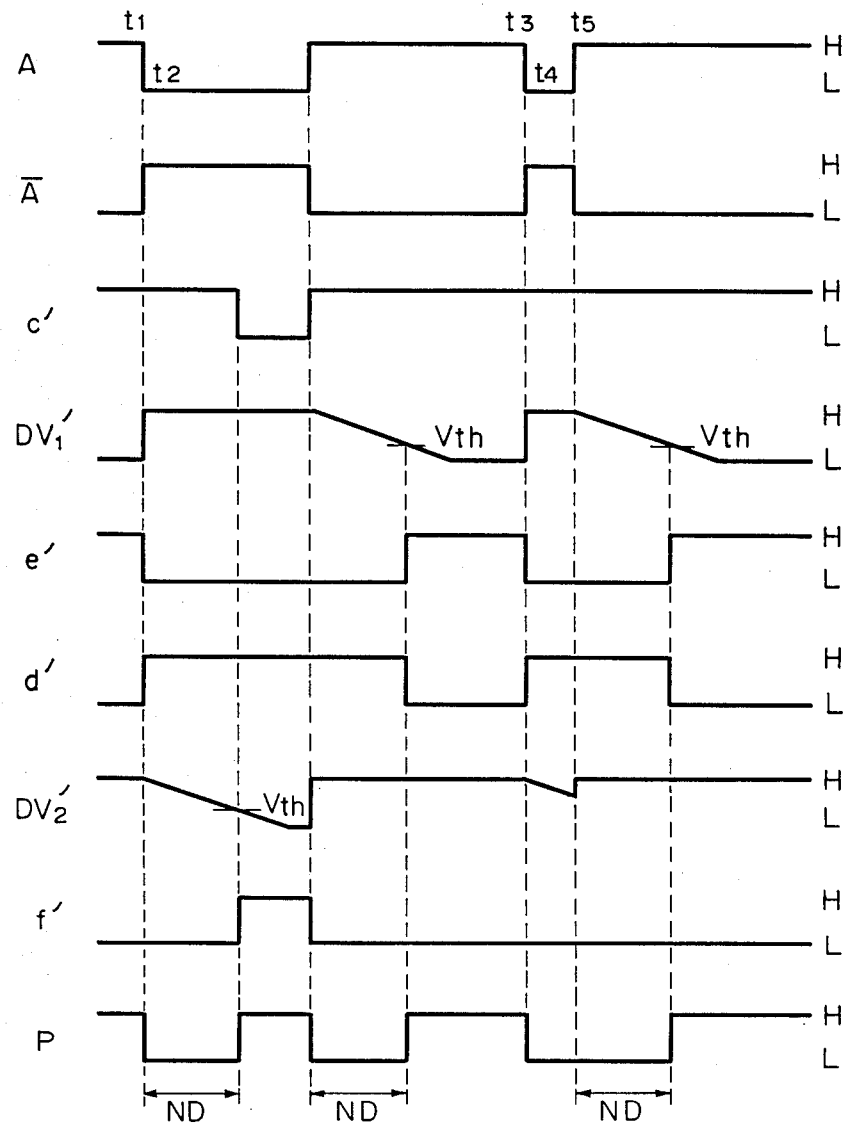
FIG. 4 is a waveform diagram of the circuit in FIG. 3.

As can be seen in comparison with the circuit in FIG. 1, the circuit in FIG. 3 is provided with a delay circuit 24 including a NAND gate 26, a resettable delay circuit 28, and an inverter 30, instead of the delay circuit 14, and a delay circuit 25 including a NAND gate 27, a resettable delay circuit 29, and an inverter 31, instead of the delay circuit 15. In FIG. 4, a prime is added to the reference characters corresponding to c, d, e, f and $DV_1$, $DV_2$ in FIG. 2.

As shown in FIG. 4, in this circuit the output pulse P is initiated from the start of the address signal change and is ended after the delay time ND from the last address signal change, when the address signal change occurs at a short interval. Thus the output P having a short pulse width is not generated.

Namely, when the address signal A is H and the inverted address signal $\overline{A}$ is L, at the time $t_3$, the output c' of the NAND gate 22 is H, the output of the NAND gate 26 is L, the output e' of the inverter 30 is H, the output d' of the NAND gate 21 is L, and the output P of the NAND gate 23 is H. At the time $t_4$, when the address signal A is L and the inverted address signal $\overline{A}$ is H, the output d' of the NAND gate 21 is H and the output P of the NAND gate 23 is L. When the output d' of the NAND gate 21 is H, the output of the NAND gate 27 is L. After the lapse of the delay time of the resettable delay circuit 29, the output f' of the inverter 31 is H, the output c' of the NAND gate 22 is L, and the output P of the NAND gate 23 is H. If before the lapse of the delay time ($t_5$) the address signal A becomes H, and the inverted address signal $\overline{A}$ becomes L, the output c' of the NAND gate 22 is H. At this time, in the circuit in FIG. 1 the output e of the delay circuit 14 is H, the output d of the NAND gate 11 is L, and therefore, the output P of the NAND gate 13 is H. But, in the circuit in FIG. 3, when the address signal A is L the resettable delay circuit 28 is reset by the H level output of the NAND gate 26, and thus the output of the resettable delay circuit 28 is H. Therefore, the output e' of the inverter 30 is L, the output d' of the NAND gate 21 is H, and the output P of the NAND gate 23 remains L. Successively, even when the address signal A is L and the inverted address signal $\overline{A}$ is H, the output d' of the NAND gate 21 is H, the resettable delay circuit 29 is reset by the H output of the NAND gate 27, because the inverted address signal $\overline{A}$ is L, the output of the resettable delay circuit 29 is H, the output f' of the inverter 31 is L, the output c' of the NAND gate 22 is H, and the output P of the NAND gate 23 remains at L. If, at this time, the change of the address stops and the address signal A remains L and the inverted address signal $\overline{A}$ remains H, the circuit operates normally. In this state, since the output d' of the NAND gate 21 is H, the output of the NAND gate 27 is L, and the resettable delay circuit 29 starts to count a time. After the lapse of a predetermined delay time ND, the output of the resettable delay circuit 29 becomes L, the output f' of the inverter 31 becomes H, the output c' of the NAND gate 22 becomes L, and the output P of the NAND gate 23 becomes H.

In FIG. 1, when the delay circuit 15 determines the pulse width of the output P, the delay circuit 14 is not used. Moreover, the delay circuit 14 generates the H output, and when the address signal A is H, the output d of the NAND gate 11 is made L and the output P of the NAND gate 13 is made H. These are disadvantageous incurred by the generation of the pulse having the narrower pulse width. Assuming that the change of the address is generated within the delay time ND, the address signal A is H, and the inverted address signal $\overline{A}$ is L, then at this time, the output e of the delay circuit 14 is still H, the output d of the NAND gate 11 is made L, and the output P of the NAND gate 13 is made H. At this time (A is L), the output e of the delay circuit 14 has no relation to the determination of the pulse width of the output P, and therefore, it does not matter if the output e is L when the address signal A is L. Using the above-mentioned circuit, when the address signal A is H, the output d does not become L.

In the present invention, when the address signal A is L, the resettable delay circuit 28 is reset, and the output thereof is made H and then made L through the inverter 30. The resettable delay circuit 29 is reset when the inverted address signal $\overline{A}$ is L and the output f' is made L. Thus, if the address signal A is H, the output d' of the NAND gate 21 is H, and the generation of the output pulse P having a narrow pulse width can be prevented.

Figure 5:
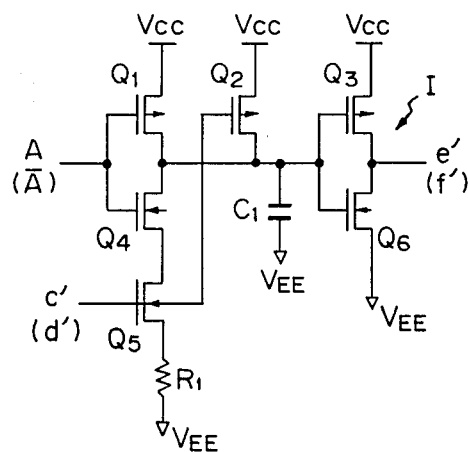
FIG. 5 is a circuit diagram showing an example of the delay circuit in FIG. 3.

A concrete example of the delay circuit 24, which is as same as the delay circuit 25, is shown in FIG. 5. The delay circuit 24 comprises p channel MOS transistors $Q_1$, $Q_2$, and $Q_3$, n channel MOS transistors $Q_4$, $Q_5$, and $Q_6$, a capacitor $C_1$, and a resistance $R_1$. In the delay circuit 24, the NAND gate 26 or 27 is composed of the p channel transistors $Q_1$ and $Q_2$, and n channel transistors $Q_4$ and $Q_5$; the resettable delay circuit 28 or 29 is composed of the capacitor $C_1$ and the resistance $R_1$; and the inverter 30 or 31 is composed of the p channel MOS transistor $Q_3$ and the n channel MOS transistor $Q_6$ Preferably, the MOS transistors $Q_1$ and $Q_2$ have a large W/L (channel width/channel length), and the MOS transistors $Q_4$ and $Q_5$ have a small W/L. In FIG. 5, $V_{CC}$ is a positive terminal and $V_{EE}$ is a negative terminal, of the power source.

Figure 6:
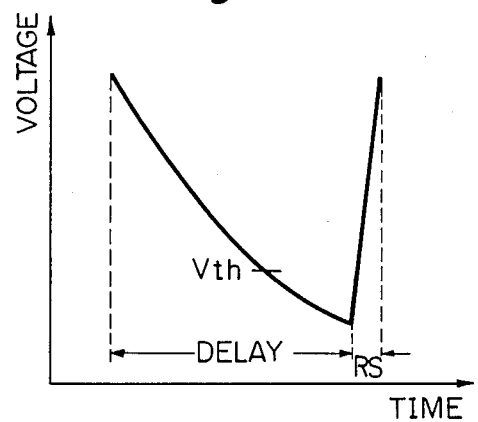
FIG. 6 is a graph showing a voltage change across the capacitor in the circuit in FIG. 5.

FIG. 6 shows the voltage change across the capacitor $C_1$ in the circuit of FIG. 5. As shown in the figure, the charge of the charged capacitor $C_1$ is gradually discharged through the resistance $R_1$, transistors $Q_4$ and $Q_5$ following the time constant $R_1 \times C_1$ by applying a high level at the gate thereof, and thus the voltage across the capacitor $C_1$ is decreased. When the voltage has decreased to a value $V_{th}$, the output level is inverted by the inverter. The operating voltage of the inverter is determined by the W/L of the transistors $Q_3$ and $Q_6$. In the figure, the reset (RS) is shown by the steep slant at the right. When the capacitor $C_1$ is reset, the capacitor is abruptly charged, following the slant, and the voltage across the capacitor is returned to a high level through the transistor $Q_1$ or $Q_2$ by applying a low level at the gate thereof. The output levels of the resettable delay circuits 28 and 29 in the circuit in FIG. 3 are shown as $DV_1'$ and $DV_2'$ in FIG. 4, respectively.

Figure 7:
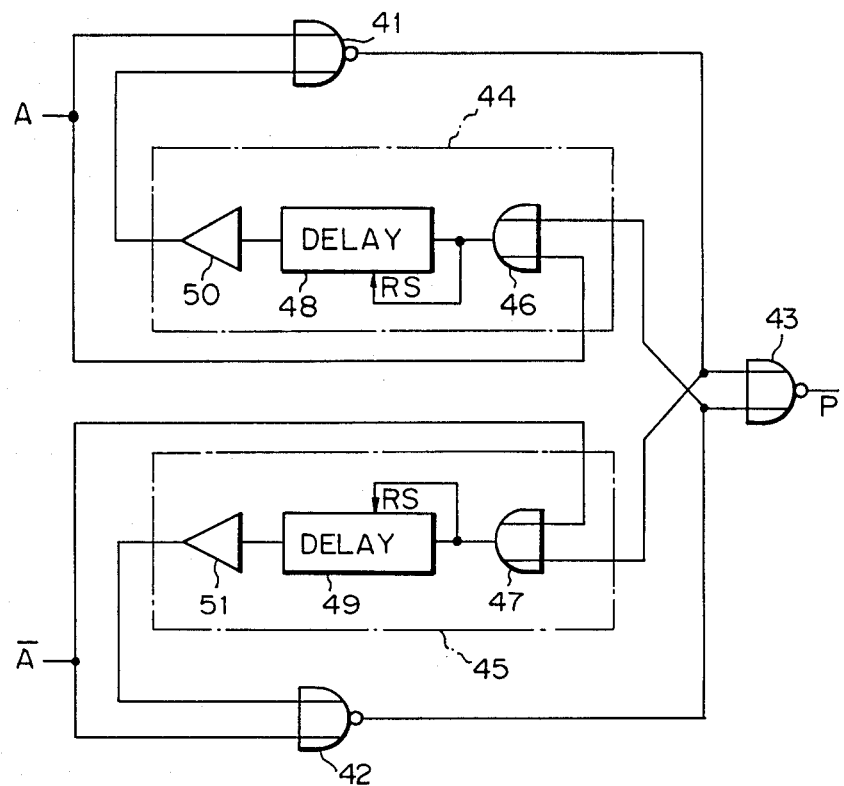
FIG. 7 is a circuit diagram of a second embodiment of the present invention; and, FIG. 8 is a waveform diagram showing an output voltage of the circuit in FIG. 7.
Figure 8:
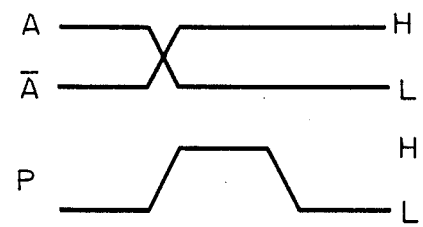

FIG. 7 shows a circuit according to a second embodiment of the present invention. In this circuit, compared with the first embodiment, NOR gates 41, 42, and 43 are used instead of the NAND gates 21, 22, and 23, OR gates 46 and 47 are used instead of the NAND gates 26 and 27, amplifiers 50 and 51 are used instead of the inverters 30 and 31, and the resettable delay circuits 48 and 49 are reset so that when the address signal A or the inverted address signal $\bar{A}$ is H, the output of the resettable delay circuit 48 or 49 is H, respectively. The operation of this circuit is substantially the same as that of the circuit of the first embodiment, except that the polarity of the output P is H as shown in FIG. 8.

The circuits of the present invention can be advantageously used in a semiconductor memory device because the circuits can generate a pulse always having a pulse width no shorter than a predetermined value if an abnormal change of an address signal occurs.

I claim:

1. A semiconductor integrated circuit with a detection circuit for detecting a change of an input signal comprising:
    a first gate circuit for receiving an input signal at one input thereof;
    a second gate circuit for receiving an inverted input signal at one input thereof;
    a third gate circuit for receiving outputs of said first gate circuit and said second gate circuit;
    a first resettable delay circuit for receiving an output of said second gate circuit, to delay said output of said second gate circuit for a predetermined time interval, and to supply an output thereof to another input of said first gate circuit; and
    a second resettable delay circuit for receiving an output of said first gate circuit, to delay said output of said first gate circuit for a predetermined time interval, and to supply an output thereof to another input of said second gate circuit;
    said first resettable delay circuit receiving the input signal at a reset input and being reset in response to a change of the input signal;
    said second resettable delay circuit receiving the inverted input signal at a reset input and being reset in response to a change of the inverted input signal.

2. A semiconductor integrated circuit as set forth in claim 1, wherein said first, second, and third gate circuits are NAND gates.

3. A semiconductor integrated circuit as set forth in claim 1, wherein said first, second, and third gate circuits are NOR gates.

4. A semiconductor integrated circuit as set forth in claim 2, wherein each resettable delay circuit comprises a capacitor, a resistance, first, second, third, and fourth transistors, and an inverter;
    said capacitor being charged to a high level through said first transistor when said first transistor receives at a gate thereof a low level signal from said input signal or said inverted input signal;
    said capacitor being charged to a high level through said second transistor when said second transistor receives at a gate thereof a low level signal from an output of a gate circuit connected to an output of said other resettable delay circuit;
    an electric charge in said capacitor being discharged through said third transistor, said fourth transistor, and said resistance when said third transistor receives at a gate thereof a high level signal from said input signal or said inverted input signal, and when said fourth transistor receives at a gate thereof a high level signal from said output of said gate circuit connected to said output of said other resettable delay circuit; and
    a voltage across said capacitor being amplified and inverted by a predetermined threshold through said inverter and supplied as an output.

* * * * *